(12) United States Patent
Ping et al.

(10) Patent No.: US 6,518,117 B2
(45) Date of Patent: Feb. 11, 2003

(54) METHODS OF FORMING NITROGEN-CONTAINING MASSES, SILICON NITRIDE LAYERS, AND CAPACITOR CONSTRUCTIONS

(75) Inventors: Er-Xuan Ping, Meridian, ID (US); Zhiping Yin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/823,200

(22) Filed: Mar. 29, 2001

(65) Prior Publication Data

US 2002/0142541 A1 Oct. 3, 2002

(51) Int. Cl.⁷ .......................... H01L 21/8242
(52) U.S. Cl. ................ 438/239; 438/238; 438/240; 438/241; 438/253; 438/256; 438/381; 438/393; 438/399; 438/202
(58) Field of Search ................ 438/239, 238, 438/240, 241, 253, 254, 255, 256, 381, 393, 394, 395, 396, 397, 398, 399, 202

(56) References Cited

U.S. PATENT DOCUMENTS

| | | | |
|---|---|---|---|
| 5,492,852 A | * | 2/1996 | Minami |
| 5,508,222 A | * | 4/1996 | Sakao |
| 5,858,831 A | * | 1/1999 | Sung ......................... 438/241 |
| 5,874,335 A | * | 2/1999 | Jeng et al. .................. 438/253 |
| 5,981,337 A | * | 11/1999 | Chuang ....................... 438/253 |
| 6,156,594 A | * | 12/2000 | Gris .......................... 438/202 |
| 6,165,839 A | * | 12/2000 | Lee et al. ................... 438/253 |
| 6,355,182 B2 | * | 3/2002 | Thrakur et al. ............... 216/57 |

FOREIGN PATENT DOCUMENTS

FR    0843355 A1  *  5/1998  ....... H01L/21/8249

* cited by examiner

*Primary Examiner*—Matthew Smith
*Assistant Examiner*—V. Yevsikov
(74) *Attorney, Agent, or Firm*—Wells St. John P.S.

(57) ABSTRACT

The invention encompasses a method of forming a silicon nitride layer. A substrate is provided which comprises a first mass and a second mass. The first mass comprises silicon and the second mass comprises silicon oxide. A sacrificial layer is formed over the first mass. While the sacrificial layer is over the first mass, a nitrogen-containing material is formed across the second mass. After the nitrogen-containing material is formed, the sacrificial layer is removed. Subsequently, a silicon nitride layer is formed to extend across the first and second masses, with the silicon nitride layer being over the nitrogen-containing material. Also, a conductivity-enhancing dopant is provided within the first mass. The invention also pertains to methods of forming capacitor constructions.

62 Claims, 4 Drawing Sheets

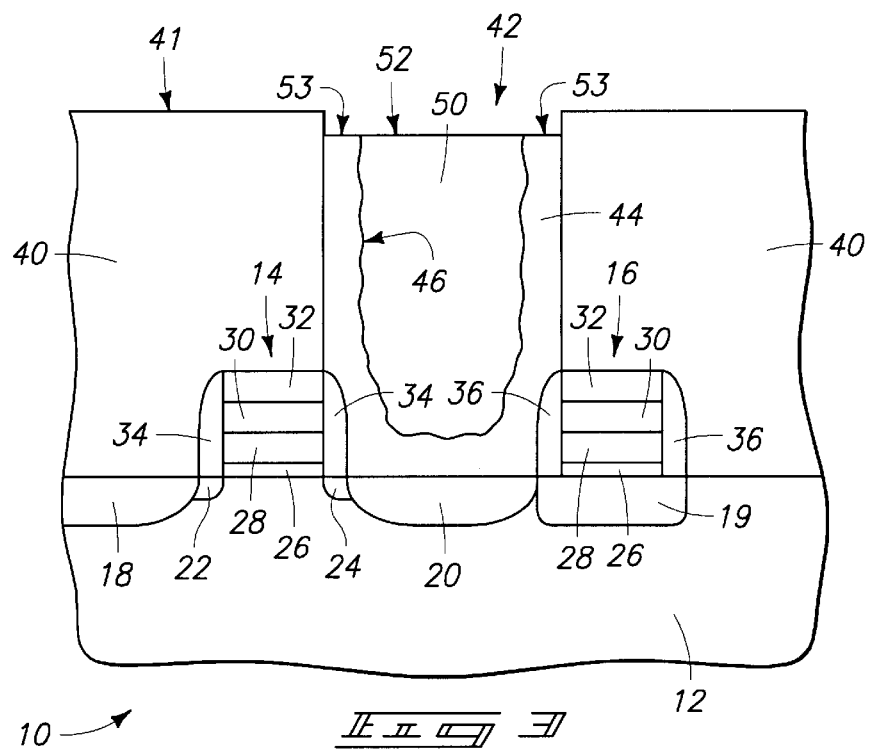
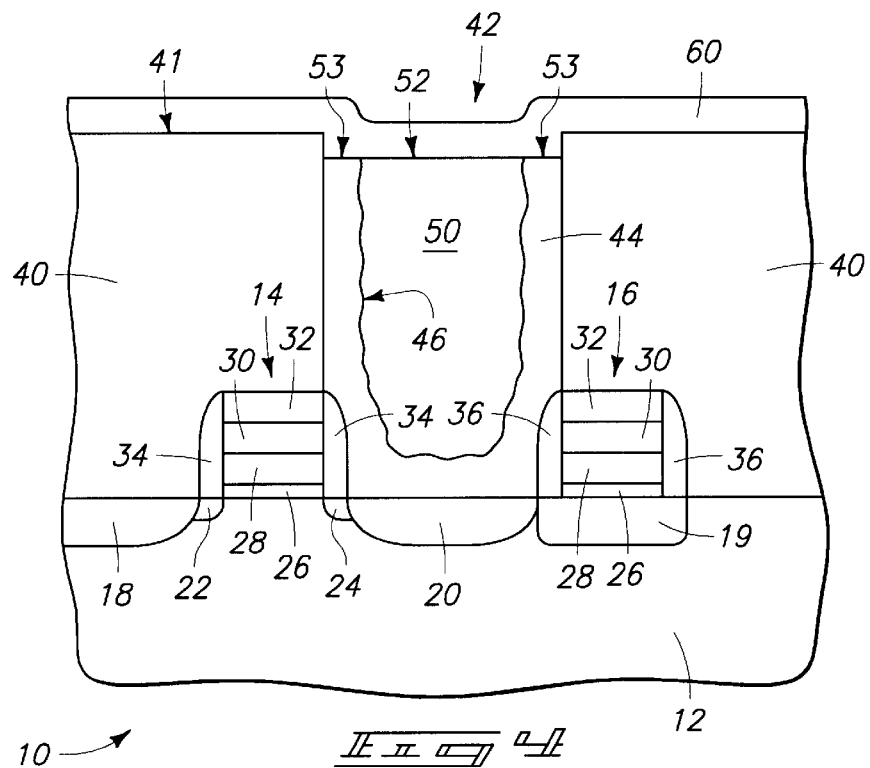

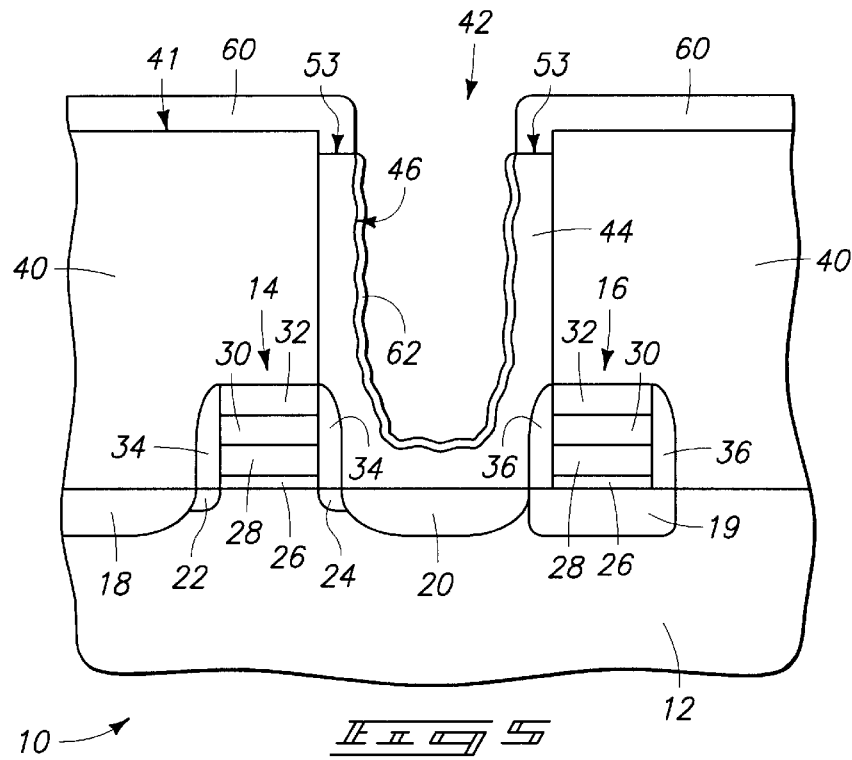
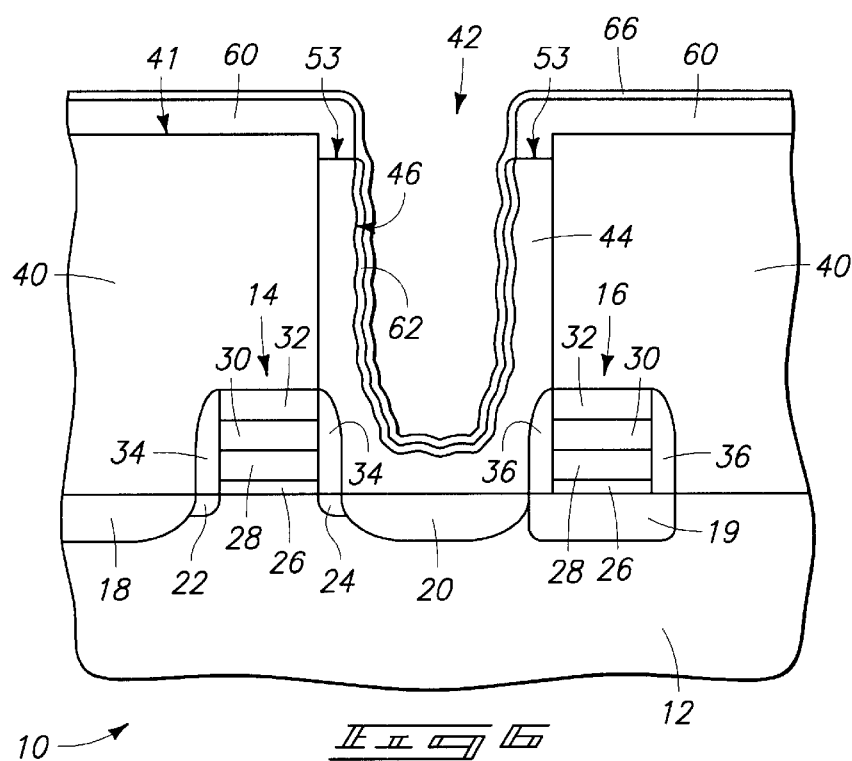

METHODS OF FORMING NITROGEN-CONTAINING MASSES, SILICON NITRIDE LAYERS, AND CAPACITOR CONSTRUCTIONS

TECHNICAL FIELD

The invention pertains to methods of forming nitrogen-containing masses and silicon nitride layers. The invention also pertains to methods of forming capacitor constructions.

BACKGROUND OF THE INVENTION

Silicon nitride is commonly utilized as an insulative material during semiconductor device fabrication. For instance, silicon nitride can be utilized as a dielectric material in capacitor constructions. Another use for silicon nitride in semiconductor device fabrication is as a barrier layer to impede migration of, for example, oxygen, hydrogen, and metallic materials.

It can be desired to simultaneously deposit silicon nitride over a conductively-doped silicon material and a silicon oxide. For instance, it can be desired to deposit silicon nitride over conductively-doped polycrystalline silicon to form an insulative material over the polycrystalline silicon, and to simultaneously deposit the silicon nitride over borophosphosilicate glass (BPSG) to form a barrier layer over the BPSG.

A difficulty that can occur during such simultaneous deposition of silicon nitride is that the silicon nitride can form much more rapidly over the polycrystalline silicon than over the BPSG. Specifically, a nucleation rate of silicon nitride on silicon is typically significantly higher than it is on silicon oxides. Accordingly, the silicon nitride thickness over the polycrystalline silicon will be much thicker than that over the silicon oxide. For instance, a 50 Å thick silicon nitride layer can be formed on hemispherical grain polysilicon in about the time that it takes to grow a 20 Å thick silicon nitride layer on BPSG. The 20 Å thick silicon nitride layer may not be sufficient to be a suitable barrier layer to subsequent penetration of undesirable materials through the silicon nitride and into the BPSG. If materials penetrate into the BPSG, they can subsequently penetrate through the BPSG and to an underlying active region, which can ultimately cause failure of devices formed relative to the active region.

One solution to the above-described difficulty is to grow a thicker layer of silicon nitride on the polycrystalline silicon to enable a sufficiently thick barrier layer to be formed on the BPSG. However, such can result in too thick of a silicon nitride layer being deposited on the polycrystalline silicon for later use as a dielectric material in a capacitor device. It would be desirable to develop methodology whereby silicon nitride can be simultaneously deposited over a silicon oxide and a conductively-doped silicon material, with the deposition rate being substantially the same over both the silicon oxide-containing material and the conductively-doped silicon material.

SUMMARY OF THE INVENTION

In one aspect, the invention encompasses a method of forming a nitrogen-containing mass. A substrate is provided, and the substrate comprises a silicon-containing mass and a silicon oxide-containing mass. The silicon-containing mass has substantially no oxygen therein. A first nitrogen-containing mass is formed to be across the silicon oxide-containing mass and not across the silicon-containing mass. After the first nitrogen-containing mass is formed, a second nitrogen-containing mass is formed to extend across the silicon-containing mass and across the silicon oxide-containing mass, with the second nitrogen-containing mass being over the first nitrogen-containing mass.

In another aspect, the invention encompasses a method of forming a silicon nitride layer. A substrate is provided which comprises a first mass and a second mass. The first mass comprises silicon and the second mass comprises silicon oxide. A sacrificial layer is formed over the first mass. While the sacrificial layer is over the first mass, a nitrogen-containing material is formed across the second mass. After the nitrogen-containing material is formed, the sacrificial layer is removed. Subsequently, a silicon nitride layer is formed to extend across the first and second masses, with the silicon nitride layer being over the nitrogen-containing material. Also, a conductivity-enhancing dopant is provided within the first mass.

In yet another aspect, the invention pertains to methods of forming capacitor constructions.

BRIEF DESCRIPTION OF THE DRAWINGS

Preferred embodiments of the invention are described below with reference to the following accompanying drawings.

FIG. 3 is a view of the FIG. 1 wafer fragment shown at a processing step subsequent to that of FIG. 2.

FIG. 4 is a view of the FIG. 1 wafer fragment shown at a processing step subsequent to that of FIG. 3.

FIG. 5 is a view of the FIG. 1 wafer fragment shown at a processing step subsequent to that of FIG. 4.

FIG. 6 is a view of the FIG. 1 wafer fragment shown at a processing step subsequent to that of FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
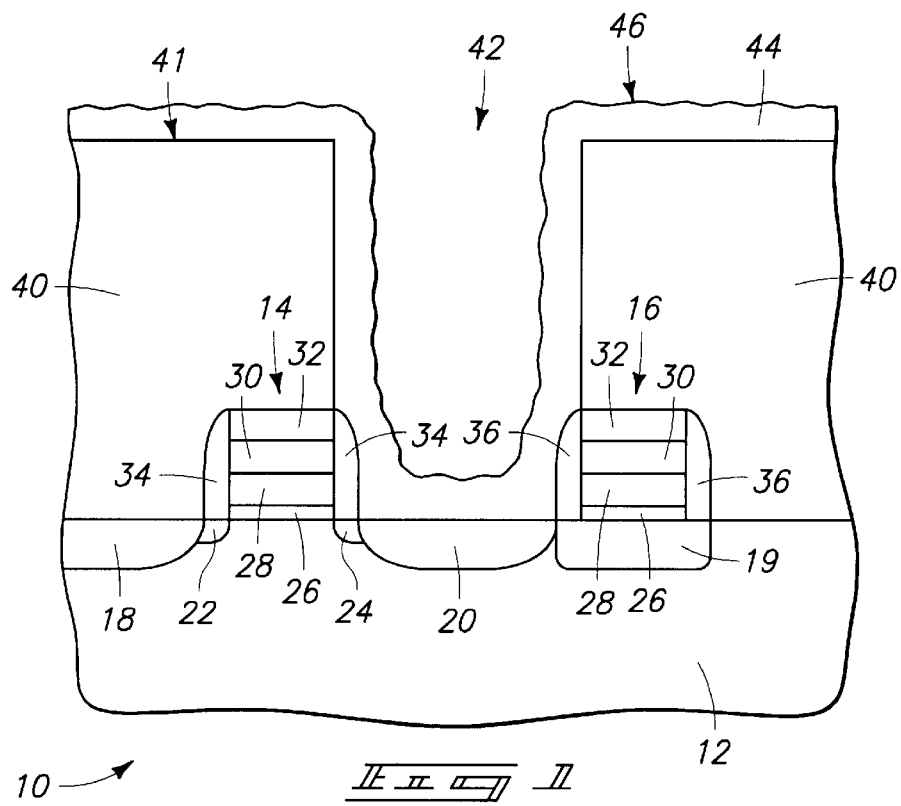
FIG. 1 is a diagrammatic, cross-sectional view of a semiconductor wafer fragment at a preliminary processing step of a method of the present invention.

An exemplary process of the present invention is described with reference to FIGS. 1–7. Referring initially to FIG. 1, a semiconductor wafer fragment 10 is illustrated at a preliminary processing step of a method of the present invention. Wafer fragment 10 includes a substrate 12. Substrate 12 can comprise, for example, monocrystalline silicon lightly doped with p-type background dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of wordlines 14 and 16 are supported by substrate 12. Wordline 16 is provided on an isolation region 19 which can comprise, for example, a shallow trench isolation region of silicon dioxide. Wordline 14 has a pair of source/drain regions 18 and 20 provided adjacent thereto, and functions as a transistor gate to gatedly couple source/drain regions 18 and 20 with one another. Source/drain regions 18 and 20 can comprise, for example, n-type or p-type doped regions of semiconductive substrate 12. Source/drain regions 18 and 20 would typically be heavily-doped (with the term "heavily-doped" referring to a dopant concentration of at least $10^{19}$ atoms/cm$^3$). Also shown in FIG. 1 are lightly-doped source/drain regions 22 and 24 (with the term "lightly-doped" referring to a source/drain region having a dopant concentration of less than $10^{19}$ atoms/cm$^3$) which extend from wordline 14 to heavily-doped regions 18 and 20. Regions 22 and 24 can comprise either n-type dopant or p-type dopant.

Wordlines 14 and 16 comprise layers 26, 28, 30 and 32 patterned into stacks. Layer 26 is a pad oxide, and typically comprises silicon dioxide; layer 28 typically comprises conductively-doped silicon, such as, for example, conductively-doped polycrystalline silicon; layer 30 typically comprises metal silicide, such as, for example, tungsten suicide or titanium silicide; and layer 32 typically comprises an insulative cap, such as, for example, silicon nitride.

A pair of sidewall spacers 34 are formed along sidewalls of wordline 14, and a pair of sidewall spacers 36 are formed along sidewalls of wordline 16. The sidewall spacers can comprise, for example, silicon nitride.

An insulative mass 40 is formed over substrate 12, and over wordlines 14 and 16. Mass 40 can comprise a silicon oxide, such as, for example, BPSG. Accordingly, mass 40 can be considered a silicon oxide-containing mask. Mass 40 has an upper surface 41.

An opening 42 is formed within mass 40 and extends to source/drain region 20. Opening 42 can be formed by, for example, providing a patterned photoresist mask (not shown) over insulative mass 40, and subsequently etching mass 40 to transfer a pattern from the patterned photoresist mask to mass 40. Subsequently, the photoresist mask can be removed.

A semiconductive material 44 is provided over mass 40 and within opening 42. Semiconductive material 44 can, for example, comprise silicon, consist essentially of silicon, consist essentially of conductively-doped silicon, or consist of conductively-doped silicon. In the shown embodiment, semiconductive material 44 has a roughened surface 46, and accordingly can correspond to rugged polycrystalline silicon, such as, for example, to hemispherical grain polysilicon.

Semiconductive material 44 is ultimately doped with conductivity-enhancing dopant to transform semiconductive material 44 into a conductive material. Such doping can occur in situ during formation of semiconductive material 44, or can occur subsequent to formation of semiconductive material 44 by, for example, ion implantation.

Semiconductive material 44 can be a silicon-containing mass having substantially no oxygen therein. It is noted that if semiconductive material 44 is a silicon-containing mass, there can be a thin layer of native oxide (not shown) that forms over layer 44 if layer 44 is exposed to an oxygen ambient. Even if such thin layer of native oxide forms over layer 44, layer 44 is still considered to have substantially no oxygen therein because the majority of the oxygen will be associated with a surface of layer 44 rather than extending into layer 44. Since there can be a small amount of oxygen that penetrates the upper surface of layer 44 during formation of native oxide across such upper surface, the term "substantially no oxygen" is utilized instead of saying that there is absolutely no oxygen within layer 44 in recognition of such small amount of oxygen that can penetrate material 44 during formation of silicon dioxide across a surface of material 44. However, even if a layer of silicon dioxide is over mass 44, the bulk of mass 44 can remain non-oxidized and can accordingly be considered to correspond to a non-oxidized silicon-containing mass.

A distinction between mass 44 and silicon dioxide mass 40 is that there will be a difference in a rate of silicon nitride formation over mass 44 relative to mass 40 if conventional methods are utilized for growing silicon nitride simultaneously over the material of mass 44 and the material of mass 40.

If desired, silicon-containing mass 44 can be treated with nitrogen to alleviate or prevent native oxide growth. For instance, a nitrogen-containing layer (not shown) can be formed over mass 44 by exposing the mass to ammonia at a temperature of from about 300° C. to about 900° C. and a pressure of from about 2 mTorr to about 1 atmosphere for a time of from about 30 seconds to about 60 minutes, to form the nitrogen layer to a thickness of less than about 10 Å. Suitable methodology can include thermal methods and/or plasma assisted methods. Preferably, the nitrogen layer will be formed to a thickness of from about 5 Å to about 10 Å, with a monolayer of the nitrogen-comprising layer being most preferred. The nitrogen-comprising layer will typically be silicon nitride. A preferred pressure for forming the nitrogen-comprising layer can be from about 1 Torr to about 10 Torr.

Figure 2:
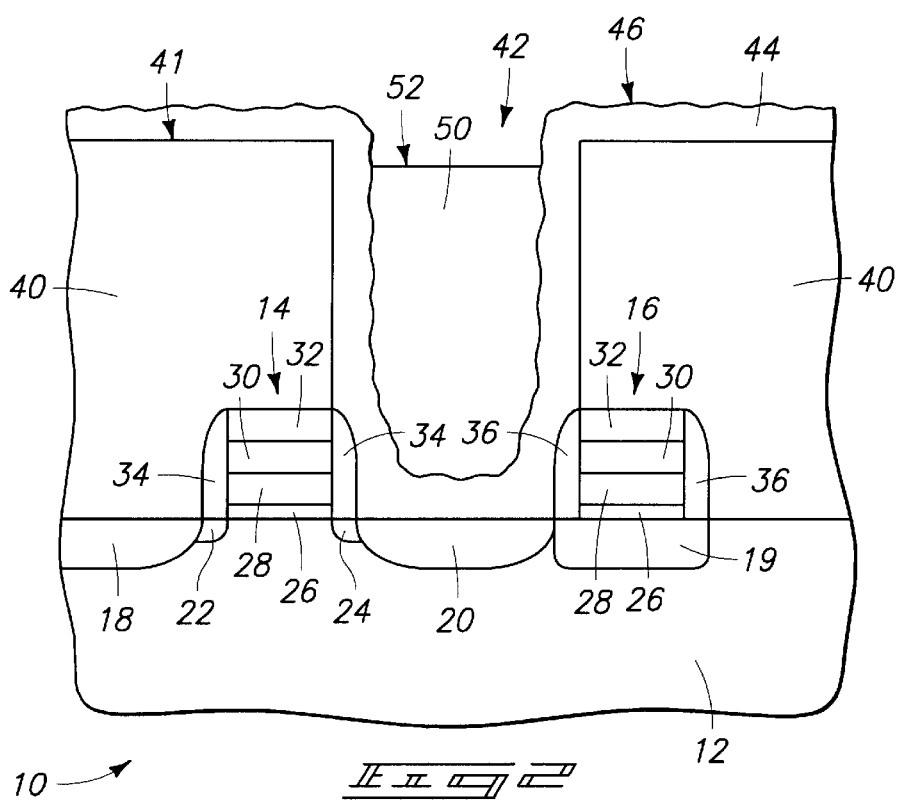
FIG. 2 is a view of the FIG. 1 wafer fragment shown at a processing step subsequent to that of FIG. 1.

Referring to FIG. 2, a sacrificial layer 50 is formed within opening 42 and over a portion of mass 44 that extends within such opening. Sacrificial material 50 can comprise, for example, photoresist, and can be formed by providing a layer of photoresist across an entirety of an upper surface of wafer fragment 10, and subsequently photolithographically patterning the photoresist to leave only a portion of the photoresist remaining within opening 42. Alternatively, the photoresist can be removed by chemical-mechanical polishing.

Photoresist 50 is shown having an upper surface 52 that is elevationally lower than upper surface 41 of insulative mass 40. It is noted that such is an exemplary application of the present invention, and that other applications are encompassed by the present invention wherein upper surface 52 is at the same elevational height as upper surface 41, or is above the elevational height of upper surface 41. Sacrificial layer 50 can also be referred to as a protective layer in that sacrificial layer 50 protects a portion of mass 44 from exposure to etching conditions, and protects mass 44 from debris associated with subsequent etching and/or polishing conditions.

FIG. 3 illustrates wafer fragment 10 after the fragment has been exposed to chemical-mechanical polishing and/or etching. Such polishing and/or etching removes mass 44 from over upper surface 41 of insulative material 40. The polish and/or etch can also remove some of insulative material 40 to reduce a height of upper surface 41. Dry or wet etching conditions can be used for removing mass 44 from over surface 41.

In the shown embodiment in which upper surface 52 of sacrificial layer 50 is provided beneath upper surface 41 of mass 40, the polish and/or etch can remove some of material 44 from within opening 42 to leave a recessed upper surface 53 of material 44 within opening 42. In other embodiments (not shown) in which sacrificial mass 50 has an upper surface coextensive with upper surface 41, or above upper surface 41, mass 44 would typically not have a recessed upper surface within opening 42.

Referring to FIG. 4, a nitrogen-containing mass 60 is formed oven upper surface 41 of silicon oxide-containing mass 40. Nitrogen-containing mass 60 can comprise, for example, silicon nitride, and can be formed by chemical vapor deposition (CVD), preferably by plasma enhanced CVD (PECVD). The CVD preferably comprises a temperature of less than or equal to 200° C., and a pressure of from about 1 Torr to about 10 Torr. The CVD conditions can be utilized to deposit less than or equal to about 200 Å of silicon nitride over silicon oxide-containing mass 40, and preferably are utilized to deposit from about 20 Å to about 30 Å of silicon nitride on silicon oxide-containing mass 40. In the shown embodiment, nitrogen-containing mass 60 extends across surface 52 of sacrificial material 50, as well as across recessed upper surfaces 53 of silicon-containing mass 44. If sacrificial mass 50 comprises photoresist, then the material will be a porous material, and accordingly the portion of nitrogen-containing mass 60 over material 50 can also be relatively porous. Such portion can thus be removed utilizing typical conditions for stripping photoresist material 50 from within opening 42.

Referring to FIG. 5, sacrificial mass 50 (FIG. 4), is removed from within opening 42. Such leaves nitrogen-containing mass 60 over silicon oxide-containing mass 40, and over upper regions 53 of silicon-containing mass 44. However, nitrogen-containing mass 60 does not extend across a predominant portion of the surface 46 of silicon-containing mass 44.

A nitrogen-containing layer 62 is shown formed over surface 46 of silicon-containing material 44. Nitrogen-containing layer 62 can comprise, for example, silicon nitride, and can be formed by exposing silicon-containing mass 44 to ammonia under the conditions described previously with respect to FIG. 1. Such exposure can, as described with respect to FIG. 1, remove native oxide from over surface 46, and form a protective silicon nitride material (shown as layer 62) over surface 46. Layer 62 can be considered a nitrogen-comprising mass formed across silicon-containing material 44, and not across silicon oxide-containing material 40. Specifically, the exposure of fragment 10 to ammonia will selectively form silicon nitride from the exposed silicon-containing surface 46, but would not form any significant amount of silicon nitride from exposed surfaces of the silicon nitride material 60 already present over silicon oxide-containing mass 40. The exposure to ammonia and formation of layer 62 shown at the processing step of FIG. 5 will typically be omitted if such exposure and nitride layer formation occurred at the FIG. 1 processing step. Generally, the particular processing steps in which it can be most suitable to expose a silicon-containing material to ammonia are during or after formation of layer 44 and before formation of layer 66.

Referring to FIG. 6, a silicon nitride layer 66 is deposited over silicon nitride materials 60 and 62. Silicon nitride layer 66 can be a thermally formed nitride, or can be deposited by, for example, low pressure chemical vapor deposition utilizing a temperature of less than or equal to 750° C., and a pressure of from about 20 mTorr to about 2 Torr. Layer 66 can be deposited to a thickness of less than or equal to about 100 Å, and preferably is deposited to a thickness of from about 40 Å to about 50 Å. Layer 66 can consist of, or consist essentially of silicon nitride.

It is noted that material 62 is an optional layer in the embodiment of FIG. 6, and that the invention also encompasses embodiments wherein layer 66 is chemical vapor deposited directly onto silicon-containing mass 44 while being deposited onto silicon nitride mass 60. Regardless, it is to be understood that silicon nitride layer 66 is deposited across silicon oxide-containing mass 40 while being simultaneously deposited across silicon-containing mass 44, and grows at about the same rate over both silicon oxide-containing mass 40 and silicon-containing mass 44.

Ultimately, silicon nitride layers 60 and 66 together comprise a barrier layer over silicon oxide-containing mass 40, and layers 62 and 66 together define a dielectric material over silicon-containing mass 44. The dielectric material extending across silicon-containing mass 44 can further comprise an oxide layer (not shown) if a native oxide remains between silicon-containing mass 44 and the deposited silicon nitride layer 66. Such silicon dioxide layer is likely to result in embodiments in which nitrogen-comprising layer 62 is omitted.

Each of layers 60, 62 and 66 can be referred to as a nitrogen-comprising mass, and each of the layers can consist of, or consist essentially of silicon nitride. In particular terminology of the present invention, layer 60 can be referred to as a first nitrogen-containing mass, layer 66 as a second nitrogen-containing mass, and layer 62 as an optional third nitrogen-containing mass.

Figure 7:
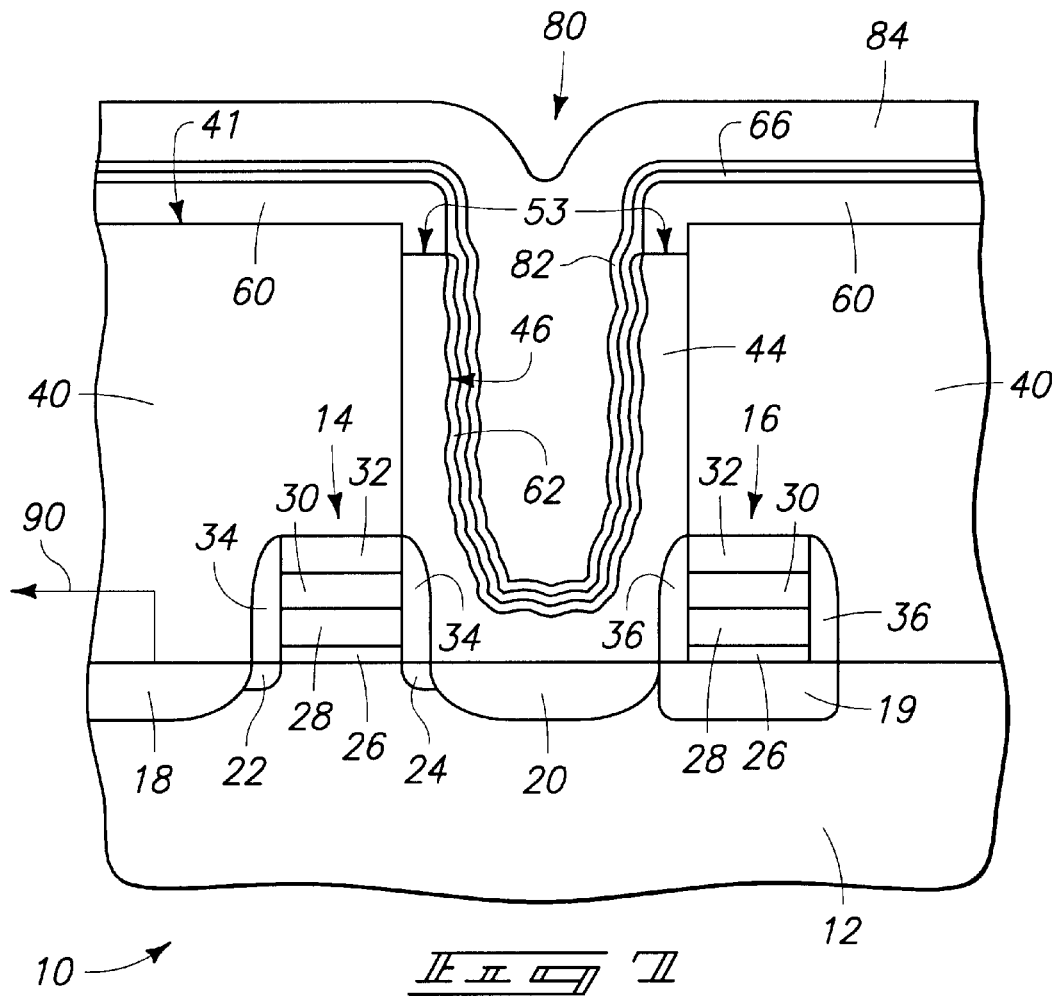
FIG. 7 is a view of the FIG. 1 wafer fragment shown at a processing step subsequent to that of FIG. 6.

FIG. 7 illustrates a capacitor construction 80 comprising the materials of the FIG. 6 construction. Capacitor construction 80 is formed by depositing a layer 82 of dielectric material over the silicon nitride layer 66. Layer 82 can comprise, for example, silicon dioxide. Of course, since silicon nitride layer 66 is itself a dielectric material, the invention also encompasses embodiments wherein layer 82 is omitted. In such embodiments, silicon nitride comprised by one or more of layers 66 and 62 can be the only dielectric material in the capacitor construction.

A conductive capacitor electrode 84 is formed over dielectric material 82. Conductive electrode 84 can comprise, for example, conductively doped polycrystalline silicon. In the capacitor construction 80, the silicon-containing material 44 is a conductively-doped material that defines a first capacitor electrode of the capacitor construction. Further, dielectric materials 62, 66 and 82 define a dielectric region of the capacitor that separates first electrode 44 from second electrode 84. Capacitor construction 80 can be incorporated into a DRAM device. In the shown embodiment, source/drain region 18 is electrically connected to a bit line 90.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a nitrogen-containing mass, comprising:

providing a substrate, the substrate comprising a silicon-containing mass and a silicon oxide-containing mass; the silicon-containing mass having substantially no oxygen therein;

forming a first nitrogen-containing mass to be across the silicon oxide-containing mass and not across a predominate portion of the silicon-containing mass; and after forming the first nitrogen-containing mass, forming a second nitrogen-containing mass which extends across the silicon-containing mass and across the silicon oxide-containing mass; the second nitrogen-containing mass being over the first nitrogen-containing mass and in physical contact with the first nitrogen-containing mass.

2. The method of claim 1 wherein the first nitrogen-containing mass is across at least some of the silicon-containing mass.

3. The method of claim 1 wherein the substrate further comprises a layer of silicon oxide over the silicon-containing mass.

4. The method of claim 1 wherein the silicon-containing mass consists essentially of silicon.

5. The method of claim 1 wherein the silicon-containing mass consists essentially of conductively-doped silicon.

6. The method of claim 1 wherein the silicon-containing mass consists of conductively-doped silicon.

7. The method of claim 1 wherein the silicon-containing mass comprises polycrystalline silicon.

8. The method of claim 1 wherein the silicon-containing mass comprises conductively-doped polycrystalline silicon.

9. The method of claim 1 wherein the silicon-containing mass comprises hemispherical grain polycrystalline silicon.

10. The method of claim 1 wherein the silicon oxide-containing mass comprises borophosphosilicate glass.

11. The method of claim 1 wherein the first nitrogen-containing mass comprises silicon nitride.

12. The method of claim 1 wherein the first nitrogen-containing mass comprises silicon nitride and is formed by chemical vapor deposition of silicon nitride on the silicon oxide-containing mass.

13. The method of claim 1 wherein the second nitrogen-containing mass comprises silicon nitride.

14. A method of forming a nitrogen-containing mass, comprising:

providing a substrate, the substrate comprising a silicon-containing mass and a silicon oxide-containing mass; the silicon-containing mass having substantially no oxygen therein;

forming a first nitrogen-containing mass to be across the silicon oxide-containing mass and not across a predominate portion of the silicon-containing mass;

after forming the first nitrogen-containing mass, forming a second nitrogen-containing mass which extends across the silicon-containing mass and across the silicon oxide-containing mass; the second nitrogen-containing mass being over the first nitrogen-containing mass; and wherein the forming the first nitrogen-containing mass to be across the silicon oxide-containing mass and not across the silicon-containing mass comprises:

forming a protective layer which is over the silicon-containing mass and not over the silicon oxide-containing mass;

forming the first nitrogen-containing mass after forming the protective layer; and removing the protective layer after forming the first nitrogen-containing mass.

15. A method of forming a nitrogen-containing mass, comprising:

providing a substrate, the substrate comprising a silicon-containing mass and a silicon oxide-containing mass;

the silicon-containing mass having substantially no oxygen therein;

forming a first nitrogen-containing mass to be across the silicon oxide-containing mass and not across a predominate portion of the silicon-containing mass;

after forming the first nitrogen-containing mass, forming a second nitrogen-containing mass which extends across the silicon-containing mass and across the silicon oxide-containing mass; the second nitrogen-containing mass being over the first nitrogen-containing mass; and forming a third nitrogen-containing mass over the silicon-containing mass prior to forming the second nitrogen-containing mass.

16. A method of forming a silicon nitride layer, comprising:

providing a substrate, the substrate comprising a non-oxidized silicon-containing mass and a silicon oxide-containing mass;

forming a sacrificial layer over the non-oxidized silicon-containing mass;

while the sacrificial layer is over the non-oxidized silicon-containing mass, forming a nitrogen-containing mass across the silicon oxide-containing mass;

after forming the nitrogen-containing mass, removing the sacrificial layer; and after removing the sacrificial layer, forming a silicon nitride layer which ex tend s across the non-oxidized silicon-containing mass and extends across the nitrogen-containing mass.

17. The method of claim 16 wherein the non-oxidized silicon of the non-oxidized silicon-containing mass comprises polycrystalline silicon.

18. The method of claim 16 wherein the non-oxidized silicon of the non-oxidized silicon-containing mass comprises hemispherical grain polycrystalline silicon.

19. The method of claim 16 wherein the silicon oxide-containing mass comprises borophosphosilicate glass.

20. The method of claim 16 wherein the nitrogen-containing mass comprises silicon nitride.

21. The method of claim 16 wherein the nitrogen-containing mass comprises silicon nitride and is formed by chemical vapor deposition of silicon nitride on the silicon oxide-containing mass.

22. The method of claim 21 wherein the nitrogen-containing mass is formed to a thickness of from about 40 Å to about 100 Å.

23. The method of claim 21 wherein the nitrogen-containing mass is formed to a thickness of from about 40 Å to about 50 Å.

24. The method of claim 16 wherein the sacrificial layer comprises photoresist.

25. The method of claim 16 further comprising forming a nitrogen-containing layer over the non-oxidized silicon-containing mass prior to forming the silicon nitride layer.

26. The method of claim 25 wherein the nitrogen-containing layer is formed prior to forming the sacrificial layer.

27. The method of claim 25 wherein the nitrogen-containing layer is formed after forming the sacrificial layer.

28. The method of claim 25 wherein the nitrogen-containing layer is formed by exposing the non-oxidized silicon-containing mass to ammonia.

29. The method of claim 25 wherein the nitrogen-containing layer is formed by exposing the non-oxidized silicon-containing mass to ammonia at a temperature of from about 300° C. to about 900° C. and a pressure of from about 2 mTorr to about 1 atmosphere.

30. The method of claim 25 wherein the nitrogen-containing layer is formed by exposing the non-oxidized silicon-containing mass to ammonia at a temperature of from about 300° C. to about 900° C. and a pressure of from about 1 Torr to about 10 Torr.

31. The method of claim 25 wherein the nitrogen-containing layer is formed to a thickness of less than or equal to about 10 Å.

32. The method of claim 25 wherein the nitrogen-containing layer is formed to a thickness of from at least about 5 Å to about 10 Å.

33. The method of claim 16 wherein the silicon nitride layer physically contacts the nitrogen-containing mass.

34. A method of forming a silicon nitride layer, comprising:
providing a substrate, the substrate comprising a first mass and a second mass, the first mass comprising silicon and the second mass comprising silicon oxide;
forming a sacrificial layer over the first mass;
while the sacrificial layer is over the first mass, forming a nitrogen-containing material across the second mass;
after forming the nitrogen-containing material, removing the sacrificial layer;
after removing the sacrificial layer, forming a silicon nitride layer which extends across the first and second masses, the silicon nitride layer being over the nitrogen-containing material; and
conductively-doping the first mass.

35. The method of claim 34 wherein the conductively-doping of the first mass occurs prior to forming the silicon nitride material.

36. The method of claim 34 wherein the first mass comprises polycrystalline silicon.

37. The method of claim 34 wherein the first mass comprises hemispherical grain polycrystalline silicon.

38. The method of claim 34 wherein the second mass comprises borophosphosilicate glass.

39. The method of claim 34 wherein the nitrogen-containing material comprises silicon nitride.

40. The method of claim 34 wherein the sacrificial layer comprises photoresist.

41. The method of claim 34 wherein the silicon nitride layer physically contacts the nitrogen-containing material.

42. A method of forming a capacitor construction, comprising:
providing a substrate, the substrate comprising a first mass and a second mass, the first mass comprising silicon and the second mass comprising silicon oxide;
forming a sacrificial layer over the first mass;
while the sacrificial layer is over the first mass, forming a nitrogen-containing material across the second mass;
after forming the nitrogen-containing material, removing the sacrificial layer;
after removing the sacrificial layer, forming a silicon nitride layer which extends across the first and second masses, the silicon nitride layer being over the nitrogen-containing material;
conductively-doping the first mass to define a first capacitor electrode; and
forming a second capacitor electrode spaced from the first capacitor electrode by at least the silicon nitride layer; the silicon nitride layer, first capacitor electrode and second capacitor electrode together defining at least a portion of a capacitor construction.

43. The method of claim 42 further comprising forming a silicon oxide layer over the silicon nitride layer prior to forming the second capacitor electrode; the second capacitor electrode being spaced from the first capacitor electrode by both the silicon nitride layer and the silicon oxide layer.

44. The method of claim 42 wherein the conductively-doping of the first mass occurs prior to forming the nitrogen-containing material.

45. The method of claim 42 wherein the first mass comprises polycrystalline silicon.

46. The method of claim 42 wherein the first mass comprises hemispherical grain polycrystalline silicon.

47. The method of claim 42 wherein the second mass comprises borophosphosilicate glass.

48. The method of claim 42 wherein the nitrogen-containing material comprises silicon nitride.

49. The method of claim 42 wherein the sacrificial layer comprises photoresist.

50. The method of claim 42 wherein the nitrogen-containing material comprises silicon nitride and is formed by chemical vapor deposit in of silicon nitride on the second mass.

51. The method of claim 50 wherein the nitrogen-containing material is formed to a thickness of from about 40 Å to about 100 Å.

52. The method of claim 50 wherein the nitrogen-containing material is formed to a thickness of from about 40 Å to about 50 Å.

53. The method of claim 42 further comprising forming a nitrogen-containing layer over the first mass prior to forming the silicon nitride layer.

54. The method of claim 53 wherein the nitrogen-containing layer is formed prior to forming the sacrificial layer.

55. The method of claim 53 wherein the nitrogen-containing layer is formed after forming the sacrificial layer.

56. The method of claim 53 wherein the nitrogen-containing layer is formed by exposing the first mass to ammonia .

57. The method of claim 53 wherein the nitrogen-containing layer is formed by exposing the first mass to ammonia at a temperature of from about 300° C. to about 900° C. and a pressure of from about 2 mTorr to about 1 atmosphere.

58. The method of claim 53 wherein the nitrogen-containing layer is formed by exposing the first mass to ammonia at a temperature of from about 300° C. to about 900° C. and a pressure of from about 1 Torr to about 10 Torr.

59. The method of claim 53 wherein the nitrogen-containing layer is formed to a thickness of less than or equal to about 10 Å.

60. The method of claim 53 wherein the nitrogen-containing layer is formed to a thickness of from at least about 5 Å to about 10 Å.

61. The method of claim 42 wherein the silicon nitride layer physically contacts the nitrogen-containing material.

62. The method of claim 40 further comprising incorporating the capacitor into a DRAM device.

* * * * *

UNITED STATES PATENT AND TRADEMARK OFFICE
CERTIFICATE OF CORRECTION

PATENT NO. : 6,518,117 B2
DATED : February 11, 2003
INVENTOR(S) : Er-Xuan Ping and Zhiping Yin It is certified that error appears in the above-identified patent and that said Letters Patent is hereby corrected as shown below:

Column 3,
Line 24, replace "suicide or titanium silicide; and layer 32 typically" with
-- silicide or titanium silicide; and layer 32 typically --

Column 4,
Line 28, replace "be formed to a thickness of from about 5 Å to about 10 Å" with
-- be formed to a thickness of from about 5 Å to about 10 Å, --
Line 29, replace ", with a monolayer of the nitrogen-comprising layer being" with
-- with a monolayer of the nitrogen-comprising layer being --

Column 8,
Line 29, replace "nitride layer with ex tend s across the non-oxidized" with
-- nitride layer with extends across the non-oxidized --

Column 10,
Line 25, replace "by chemical vapor deposit in of silicon nitride on the second" with
-- by chemical vapor deposition of silicon nitride on the second --
Line 42, replace "ammonia ." with -- ammonia. --
Line 61, replace "The method of claim 40 further comprising" with -- The method of claim 42 further comprising --

Signed and Sealed this

Nineteenth Day of August, 2003

JAMES E. ROGAN
*Director of the United States Patent and Trademark Office*